United States Patent
Harris et al.

(10) Patent No.: US 6,297,990 B1
(45) Date of Patent: *Oct. 2, 2001

(54) BALANCED REFERENCE SENSING CIRCUIT

(75) Inventors: George E. Harris, Garland; Tim Coffman, Sugarland, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,216

(22) Filed: Sep. 28, 1999

Related U.S. Application Data (60) Provisional application No. 60/102,384, filed on Sep. 29, 1998, and provisional application No. 60/109,729, filed on Nov. 23, 1998.

(51) Int. Cl.$^7$ .................................................. G11C 16/06
(52) U.S. Cl. .................. 365/185.21; 365/185.2; 257/345; 257/391
(58) Field of Search ........................... 365/185.21, 185.2, 365/185.18, 185.01; 257/345, 391, 213

(56) References Cited

U.S. PATENT DOCUMENTS

| | | | |
|---|---|---|---|
| 5,287,315 | * | 2/1994 | Scherect et al. ................. 365/210 |
| 5,936,888 | * | 8/1999 | Sugawara ...................... 365/185.2 |
| 5,973,957 | * | 10/1999 | Tedrow ........................ 365/185.03 |

* cited by examiner

*Primary Examiner*—Hoai V. Ho
(74) *Attorney, Agent, or Firm*—Wade James Brady, IIi; Frederick J. Telecky, Jr.

(57) ABSTRACT

A floating-gate memory which uses a skewed reference for sensing. The skewed reference preferably has a substantially different VT implant dose than the array cells, and can also have different sizing.

3 Claims, 6 Drawing Sheets

BALANCED REFERENCE SENSING CIRCUIT

This application claim benefit to Provisional 60/102,384 filed Sep. 29, 1998 which claims benefit to provisional 60/109,729 filed Nov. 23, 1998.

BACKGROUND AND SUMMARY OF THE INVENTION

The present invention relates to skewed reference circuits for floating-gate memories.

BACKGROUND: FLOATING-GATE MEMORIES

Memories which do not lose their contents when the power is disconnected are referred to as "nonvolatile." The most common types of nonvolatile semiconductor memories are those which exploit the properties of a floating-gate transistor. Such a transistor differs from to a normal MOS transistor in that a dielectrically isolated floating gate is interposed between a control gate and the channel. (Thus, the two gates are capacitively coupled to each other and to the channel.) The lower gate is called a "floating" gate, because it is electrically isolated. By injecting charges into the floating gate, the effective threshold voltage of the MOS transistor (as seen from the upper gate) can be changed. By applying an appropriate voltage to the control gate, and observing whether the transistor turns on, the state of the cell (i.e. whether charge is stored on the floating gate) can be detected.

Since the transistors of a memory array will always be as small as possible, the currents which must be detected will be relatively small. The sense amplifiers for floating-gate memories are differential circuits, which monitor the current drawn by a selected cell as compared with a fraction of the current from a reference cell. The reference cell must provide an output, to the sense amplifier, which is intermediate between the two possible outputs of the selected cell. This is not easy to do, since the current output of the cell will vary with temperature, power supply voltage variation, and the age of the cell.

In EPROMs, a "one" is defined as the state in which the floating gate memory cell conducts at a low threshold voltage Vt if the cell is "erased," i.e. there are no excess elections in the floating gate. A "zero" is the state in which the threshold voltage Vt of the memory cell is raised (programmed) such that the cell does not conduct under normal operating conditions. The source-drain path conducts at a relatively high threshold voltage Vt if the cell is "programmed", i.e. there are a sufficient number of electrons trapped on the floating gate to deplete the number of conductors in the source-drain path.

The margin between the threshold voltages Vt of erased memory cells and of programmed memory cells must be such that erased cells have threshold voltages Vt above a reference value and programmed cells have threshold voltages Vt below a reference accomplished by comparing the selected memory cell to a reference cell in such a way that the reference cell defines a condition, current or voltage, that resides between the "one" and "zero" state of the selected but. Both the reference cell and the selected cell have the same voltage Vcc applied to their control gates during read operations. The comparison to determine whether a "one" or a "zero" is stored on the selected cell is performed by a sense amplifier.

One previous method for improving the sensing capability of sense amplifiers includes changing the width of the load resistor/transistor on the sense amplifier. In this method, the difference between the current in the reference memory cell and in the selected memory cell is the same throughout the range from low control gate voltage Vcc to high control gate voltage Vcc.

According to a method described in U.S. Pat. No. 5,287,315 to Schreck et al., which is hereby incorporated by reference, an improvement in sense margins for both "ones" at a low control gate voltage Vcc and for "zeros" at a high control gate voltage Vcc may also be accomplished by forming the channel length of the reference memory cell to have a longer channel length than the memory cells of the array. This causes the reference memory cell to conduct much less current than the selected memory cell at low values of the control gate voltage Vcc. Because the threshold voltage Vt changes with the channel length, the sense amplifier response characteristic is skewed.

To further increase the margin between threshold voltages Vt of programmed and erased cells, the control gate of the reference cell is kept at the same potential as the control gate of the selected memory cell. As the control gate potential of both cells increases, the current of both the reference and memory cells increases. As the gate potential is elevated above a selected cell's programmed threshold voltage Vt such that the cell is conducting, the reference cell's current also increases, so that the gate potential must be raised well beyond the selected cell's threshold voltage Vt before the cell is detected as erased. Threshold Voltage (or "Vt") is simply difference that distinguishes a one from a zero. It requires a gap between the lowest voltage that can be considered a "0" and the highest voltage that can be considered a "1". In Schreck, the spread, or gap, between voltage high and voltage low of the channeled device is spread. A change in spread creates a change in margin of error.

Switches in use today are fast and will sense very quickly. It is advantageous to push the bit "low" response as low possible without failing. It is also advantageous to push the bit "high" response as high as possible.

FLOATING-GATE MEMORY SENSING WITH IMPROVED MARGIN

The present application discloses nonvolatile memories with improved sense margins. In particular, this invention relates to skewing of the characteristics of a sense amplifier by forming the reference memory cell and the individual memory cells with different device characteristics, especially channel doping levels.

Advantages of the disclosed methods and structures, in various embodiments, include better margin over temperature, process variation, aging, and/or power supply variation, for sensing.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PROFFERED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Sample Embodiment

In the presently preferred embodiment, skew between the reference cell and the array is accomplished by implanting a much heavier VT-adjust implant into the reference cell than into the array cells. In the following detailed description, specifiers such as "6/8" or "0/8" refer to the VT and pocket implants: the first number gives the dose for the VT-adjust boron implant (in units of $10^{12}$ cm$^{-2}$), and the second gives the dose for the pocket implant.

Figure 1:
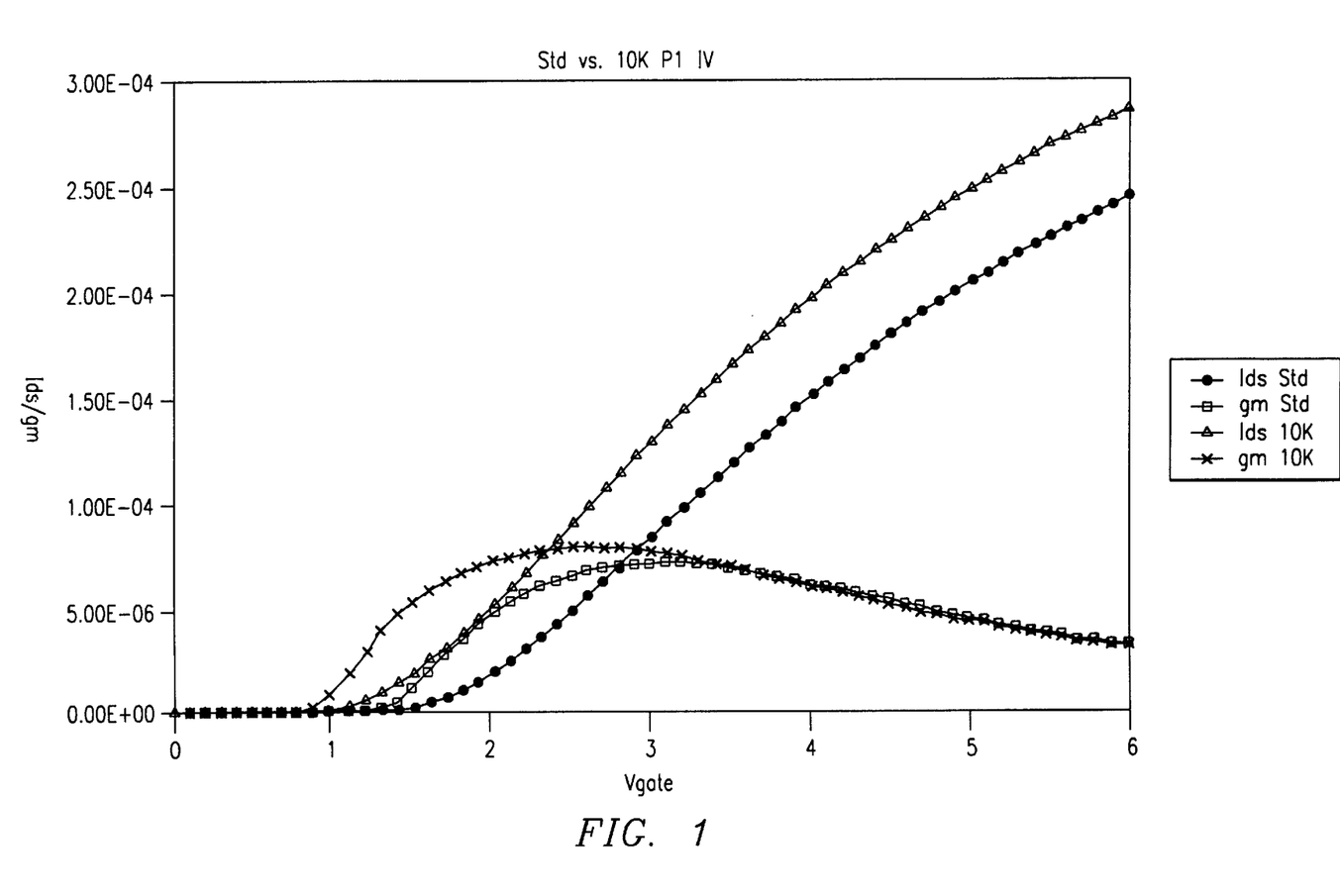
FIG. 1 shows comparative measured data, under a first set of process parameters, of Ids and transconductance gm versus gate voltage, for devices ("Std") which have a normal VT implant against devices ("10K") which do not have any VT implant.
Figure 2:
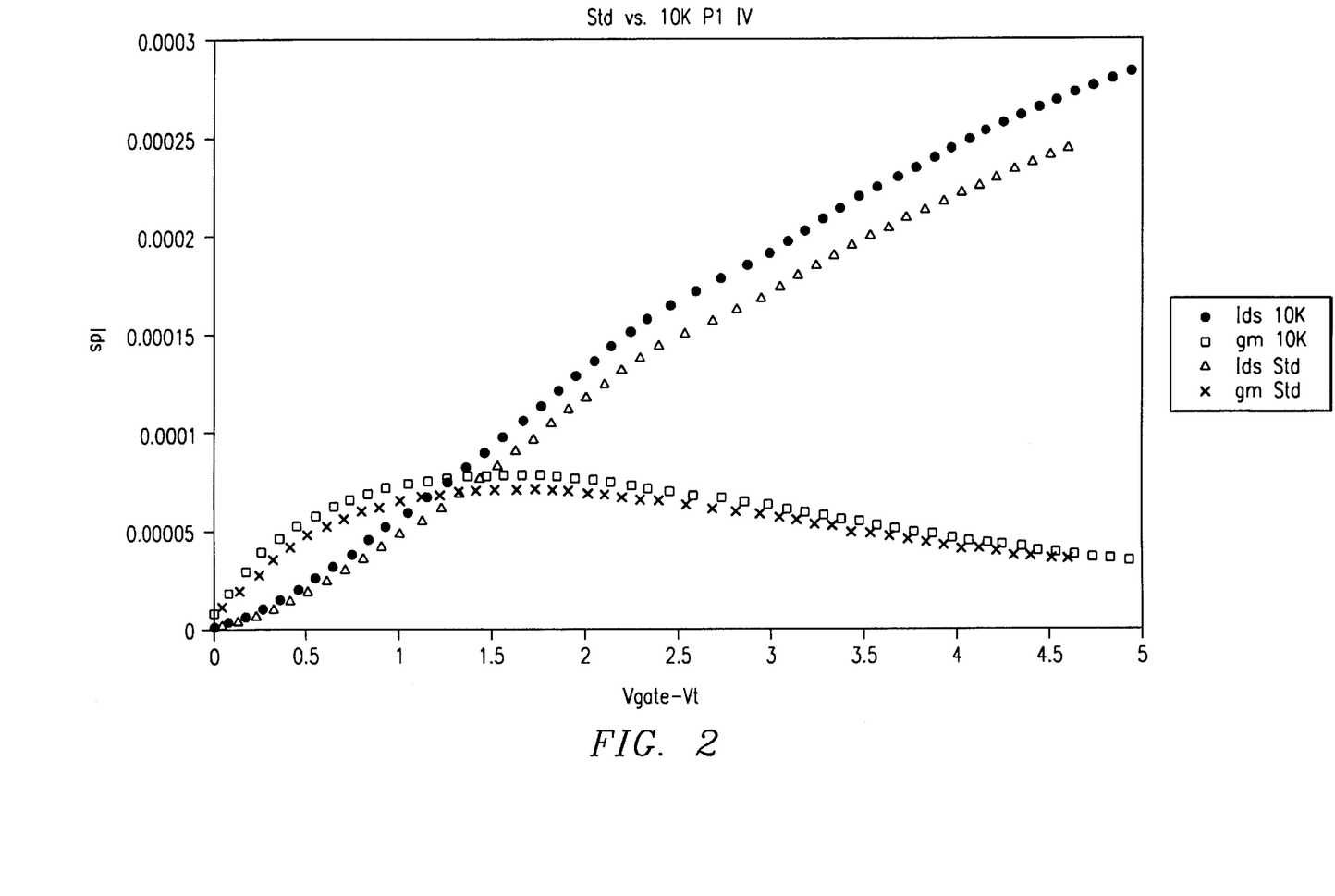
FIG. 2 compares Ids and transconductance gm versus overvoltage gate minus VT), under a first set of process parameters, for devices ("Std") which have a normal VT implant against devices ("10K") which do not have any VT implant.

FIG. 1 shows comparative measured data, under a first set of process parameters ("P1 IV"), of Ids and transconductance gm versus gate voltage, for devices ("Std") which have a normal VT implant ("6/8") against devices ("10K") which do not have any VT implant ("0/8"). FIG. 2 compares Ids and transconductance gm versus overvoltage (V gate minus VT), under a first set of process parameters, for devices ("Std") which have a normal VT implant against devices ("10K") which do not have any VT implant.

In these embodiments, the VT implant is boron at 35 keV. However, its penetration is reduced by 40 nm of overlying oxide. The pocket implant is an angled implant, at 30 keV, which goes through about 38 nm of cap oxide. The starting material is p-on-p+, with an epi resistivity of 11–15 ohm-cm. The tank dose is 3E12 cm−2 of boron, followed by a drive.

Figure 3:
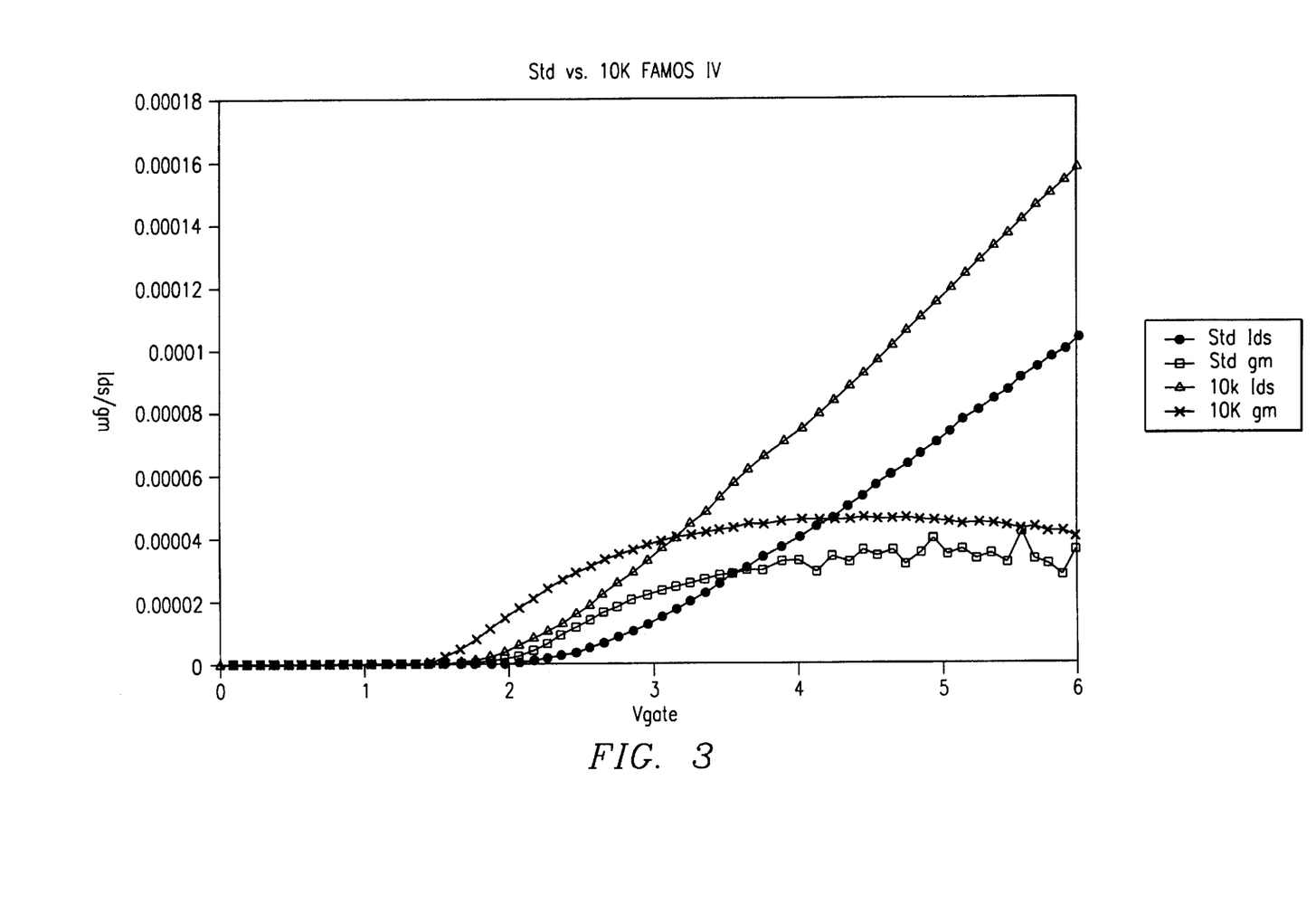
FIG. 3 shows comparative data, under a different set of process parameters, of Ids and transconductance gm versus gate voltage, for devices ("Std") which have a normal VT implant against devices ("10K") which do not have any VT implant.

FIG. 3 shows comparative data, under a different set of process parameters ("FAMOS IV"), of Ids and transconductance gm versus gate voltage, for devices ("Std") which have a normal VT implant against devices ("10K") which do not have any VT implant. This illustrates a slope change of the Vt. The figure plots the Vg change. gM is simply the derivative of the curve for each point: gm=W/L(COXUN). This is a clearly different approach than that taken by Scheck, in that instead of shifting the curve, the curve itself is changed.

Figure 4:
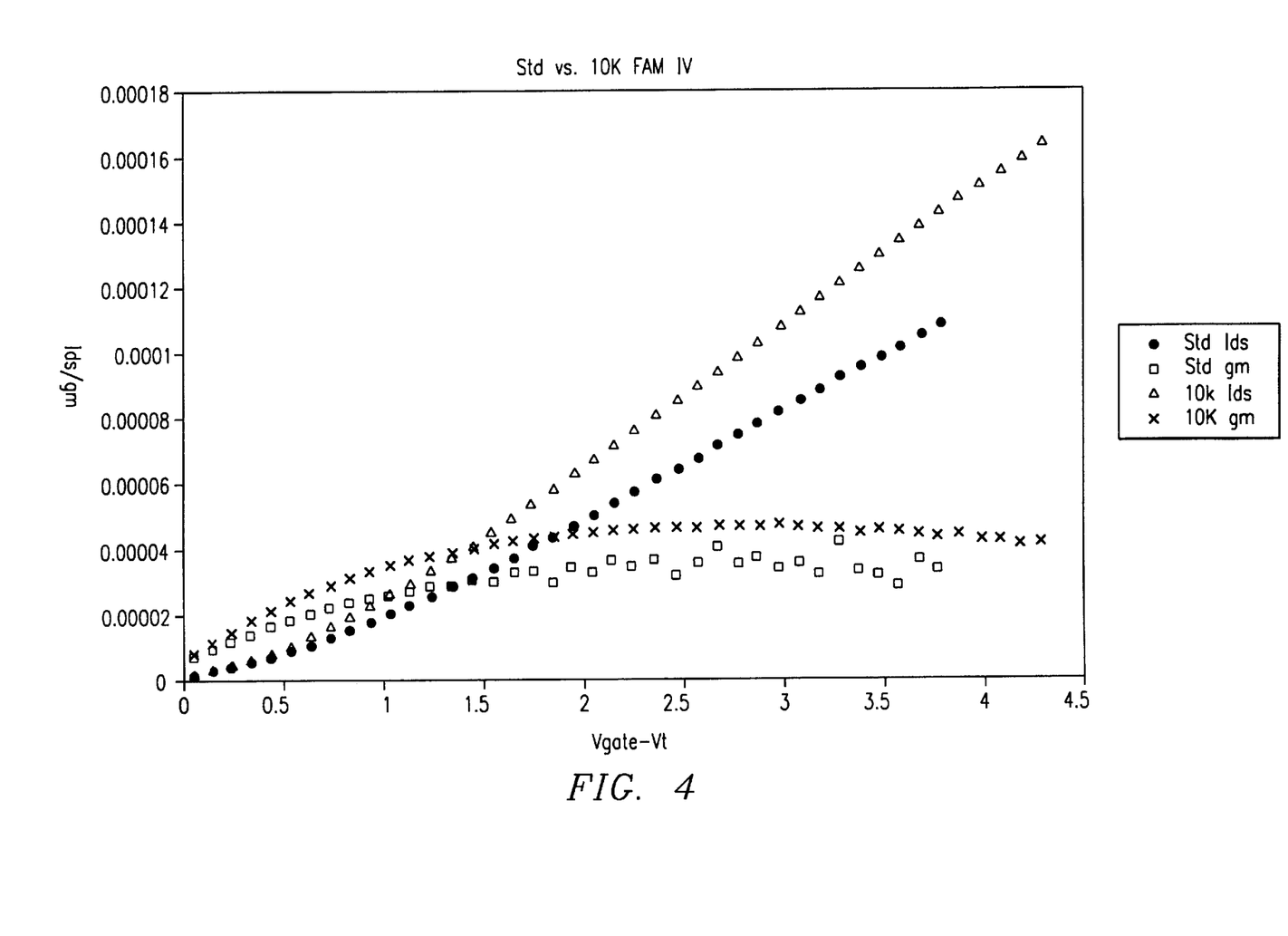
FIG. 4 compares Ids and transconductance gm versus overvoltage (V gate minus VT), under a first set of process parameters, for devices ("Std") which have a normal VT implant against devices ("10K") which do not have any VT implant.

FIG. 4 compares Ids and transconductance gm versus overvoltage (V gate minus VT), under a first set of process parameters, for devices ("Std") which have a normal VT implant against devices ("10K") which do not have any VT implant.

Figure 5A:
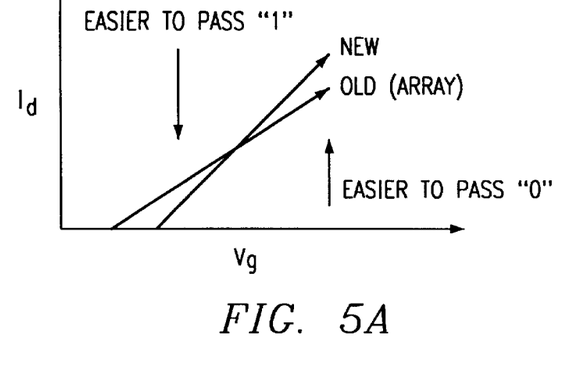
FIGS. 5A and 5B dow how the different reference and array cells track over gate voltage and over temperature.
Figure 5B:
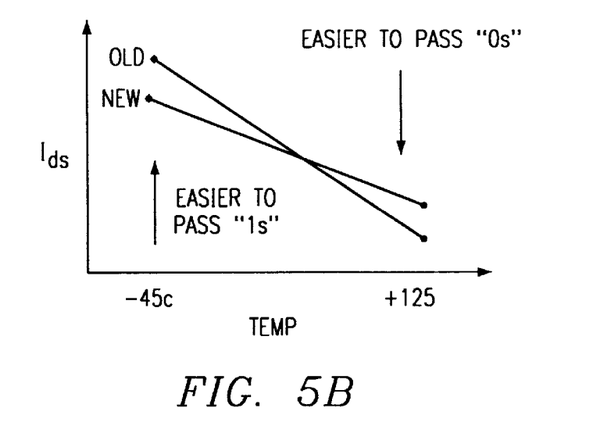

FIGS. 5A and 5B show how the different reference and array cells track over gate voltage and over temperature. The VG changes slope, and this change in slope makes it easier to pass 1s. At a high VG the change in slope makes easier to pass as 0s. Note that Scheck et al., only describes a shift in the Vt, but here, the slope and the current is changed.

Note that the threshold voltage implant is not the only parameter which can be made unequal between the array and the reference. In fact, it is preferable to adjust the sizing of the moat and gate sizes as well. When designing a floating-gate reference scheme the Poly2 CD (Critical Dimension) can/should be considered for modulation depending on the desired reference characteristics. The Poly2 CD modulates the coupling ratios of the floating-gate transistor thus modulating the I–V characteristics of the device.

A floating-gate memory made of transistors doped at 0/8 will have an endurance of about 1,000 operations (write and erase) and a block disturb tolerance approaching infinity. However, this device is considered a failure because of its low endurance. Currently, 100,000 operations is the standard. A floating-gate made of transistors doped at 6/8 has an endurance of 10,000 operations and a block disturb tolerance of 10,000 operations. This device is also considered a failure because it is below standard for both criteria. However, a floating-gate memory made of reference voltage transistors doped at 6/8 floating and gate transistors doped at 0/8 results in a device which exceeds 200,000 operations for both endurance and block disturb tolerance.

Modulating the Poly1 CD can add or detract from the available Moat (active area silicon) pitch (pitch=isolation+ active area), and thus increase or decrease the silicon area requirements of the reference. The same is true for modulating the Moat CD.

Both are strong knobs for controlling the I–V characteristics of the device. Both are knobs modulating the coupling ratios of the device and the device Ids equation (Ids=k'(W/L){(Vgs−Vt)^2}) where k'=(Cox)(mobility)(0.5).

In the case of the implementation on the AS family of devices the P1 CD was made larger (gate coupling was reduced) and Moat width was larger (gate coupling was reduced).

Transistor Skewing

The intrinsic electric potential of poly2 was changed along with the doping of the p region to make it extremely robust. The object of the changes was to skew and balance the device with what is actually happened from a temperature standpoint and a voltage stand point. The device is balanced to what will be input to the device. Rather than matching the device to its reference, it is balanced so that it works for particular conditions and is it easier for the device to operate, particularly where erasing is more difficult.

This figure depicts a graph of Ids verses Vgs, which can also be assumed to be Vcc. The 10K slopes are the old and the standard slopes are the new.

To give a practical example of the cycle life of cell memories, note that, on a typical cell phone, a phone number can be changed 10,000 times. That is a 0 can be changed to a 1 or a 1 to a 0 10,000 times without failure. A problem arises when there is a particular bit on the chip which is erased and programmed multiple times per second, minute or hour. Even though other bits on the chip are not altered, those bits along the word line to which the changed bit is connected experience stress. That is, it sees some of these potentials for some duration of time, maybe 10 years. This stress is called "block disturb".

In an alternative to the presently preferred embodiment. The source/drain area is doped with Boron at a concentration of 6e12. A heavier doping of Boron is added to the inside of both the drain and source connections (a pocket implant) at a concentration of 6e15. The Boron layer to the inside of the source is can then be etched out leaving no boron at x+602 for an 0/8 device or left untouched for a 6/8 device.

Figure 6:
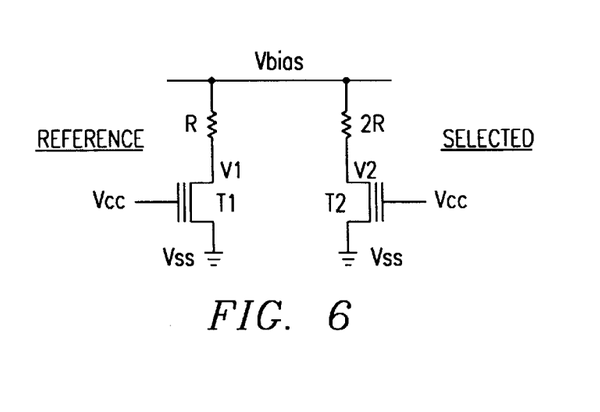
FIG. 6 shows a sample sense amplifier circuit embodiment using a current-to-voltage translator.

FIG. 6 shows a sample sense amplifier embodiment, using a current-to-voltage translator instead of a PMOS current mirror. When selected memory cell T2 is erased and conducting (a "one"), voltage V2 will be lower than voltage V1 because reference memory cell T1 is always conducting (always erased) and because R is less resistance than 2R by a factor of two. If selected memory cell T2 is programmed and not conducting (a "zero"), voltage V2 will be equal to Vbias which is higher than voltage V1 because reference memory cell T1 is always conducting. Therefore, the two states are defined. If V2 is less than V1, then the selected memory cell T2 is erased, or a "one". If V2 is greater than V1, then the selected memory cell T2 is programmed, or a "zero". However, -as control gate voltage Vcc is raised to a value sufficiently above the voltage threshold V+of a programmed selected cell T2, voltage V2 will be lower than voltage V1 because the current through selected cell T2 may be raised to at least half of the current through reference cell T1. At this point a "zero" is read erroneously as a "one".

The channel length of the reference memory cell T1 is extended to be greater than the channel length of the selected cells in the length and maimer previously discussed. The longer relative channel length reduces the drain-source current of the reference cell because of the reduction in the width-to-length ratio along with the increase of the threshold voltage Vt. The threshold voltage Vt increases because the memory cell is a short channel device and because the voltage threshold Vt of short channel devices increases as the channel length is increased.

To summarize the effect, an increased channel length in the reference cell will benefit reading ones at low control gate voltage Vcc without degrading zeros at high control gate voltage Vcc, when compared to other schemes that have no inherent benefit at low control gate voltage Vcc and no degradation at high control gate voltage Vcc.

Figure 7:
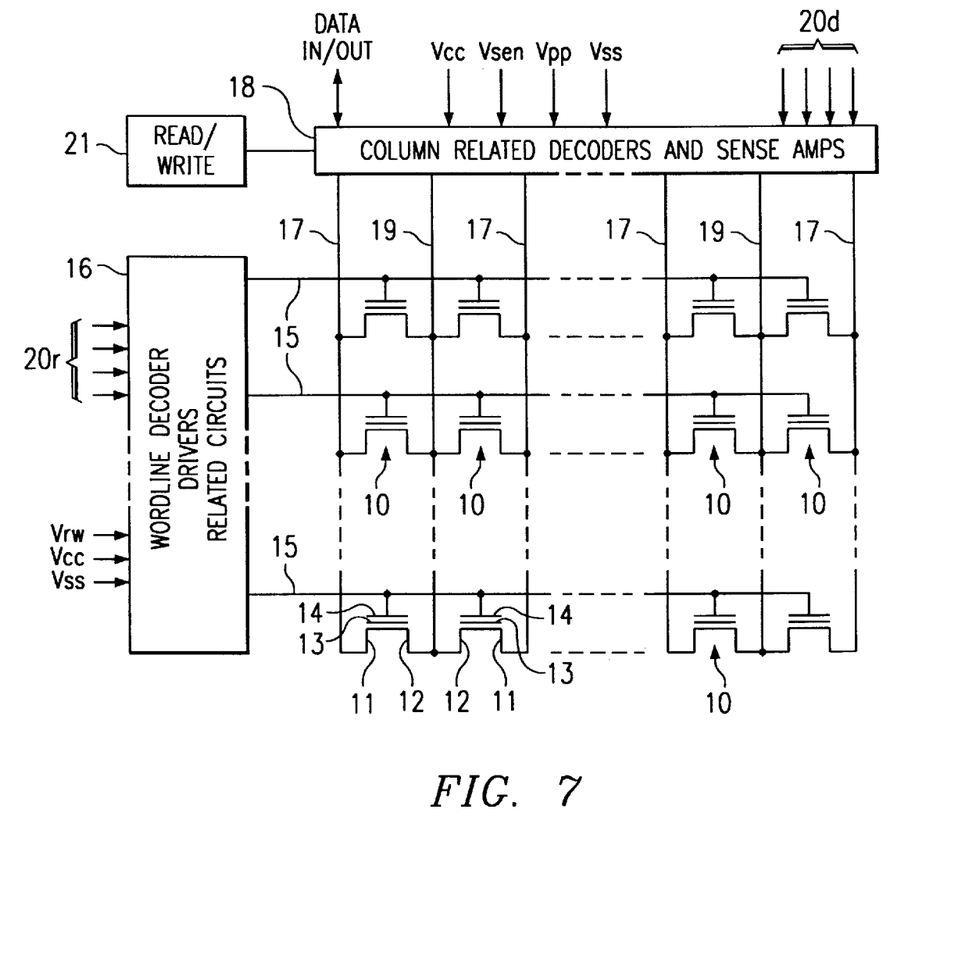
FIG. 7 is a block diagram of a floating-gate memory which can use the reference architecture of FIG. 1.

Referring to FIG. 7, an example array of memory cells, which is a part of a memory chip, is shown. Each cell 10 is a floating gate transistor having a source 11, a drain 12, a floating gate 13 and a control gate 14. Each of the control gates 14 in a row of cells 10 is connected to a wordline 15, and each of the wordlines 15 is connected to a row decoder circuit 16. Each of the sources 11 in a column of cells 10 is connected to a source-column line 17 (which may be a virtual ground line), and each of the source-column lines 17 is connected to a column decoder circuit 18. Each of the drains 12 in a column of cells 10 is connected to a drain-column line 19, and each of the drain-column lines 19 is connected to the column decoder circuit 18.

In a write or program mode, row decoder circuit 16, in response to wordline address signals An+1–Ax and to signals from read/write control circuit 8, places a first prese lected programming voltage Vpp on a selected wordline 15, including a control gate 14 of a selected memory cell 10. Column decoder circuit 18, in response to bitline address signals A0–An and to signals from read/write control circuit 8, places a second programming voltage Vrw on a selected source-column line 17 and, therefore, the source region 11 of the selected cell 10. Column decoder circuit 18 also connects a selected drain-column line 19 to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge with respect to the channel region. The injected electrons and negative program charge in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In the read mode, row decoder circuit 16, in response to wordline address signals An+1–Ax and to signals from read/write control circuit 8, applies a preselected positive voltage Vcc to the selected wordline 15 and thus to the selected control gate 14, and applies a low voltage (ground or Vss) to deselected wordlines 15. The column decoder circuit 18, in response to column address signals A0–An and to signals from read/write control circuit 8, applies a positive voltage Vsen to the selected drain-column line 19. Column decoder circuit 18 also connects all of the source-column lines 17 to ground or reference potential Vss except for the source-column line 17 sharing the same drain-column line connected to the cell 10 that is being read. That source-column line 17 is driven to the same voltage level as the selected drain-column line 19.

As is well known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit floating-gate memory, comprising:
   an array of floating-gate memory transistors, each having a first dopant concentration at the surface of a channel thereof; and
   at least one reference transistor having a second dopant concentration, different from said first dopant concentration at the surface of a channel thereof, selected so that, in conduction, the reference transistor has a characteristic of drain current with gate voltage in which an incremental increase in drain current is smaller for an incremental increase in gate voltage than in a corresponding characteristic of the memory transistors; and differential sensing circuitry for sensing a differential voltage drop across said reference transistor and a selected one of said memory transistors.

2. The memory of claim 1, wherein said reference transistor receives a threshold voltage adjust implant in its channel, and wherein the memory transistors receive substantially no threshold voltage adjust implant in their respective channels.

3. The memory of claim 1, wherein the reference transistor has a channel length that is substantially longer than a channel length of each of the memory transistors.

* * * * *